United States Patent
Preuss et al.

(10) Patent No.: US 8,790,939 B2
(45) Date of Patent: Jul. 29, 2014

(54) METHOD FOR PRODUCING A PLURALITY OF RADIATION-EMITTING COMPONENTS AND RADIATION-EMITTING COMPONENT

(75) Inventors: Stephan Preuss, Augustdorf (DE); Harald Jaeger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 338 days.

(21) Appl. No.: 12/918,364

(22) PCT Filed: Feb. 19, 2009

(86) PCT No.: PCT/DE2009/000249
§ 371 (c)(1),
(2), (4) Date: Oct. 8, 2010

(87) PCT Pub. No.: WO2009/103283
PCT Pub. Date: Aug. 27, 2009

(65) Prior Publication Data
US 2011/0127564 A1    Jun. 2, 2011

(30) Foreign Application Priority Data

Feb. 22, 2008 (DE) .......................... 10 2008 010 510
Mar. 19, 2008 (DE) .......................... 10 2008 014 927

(51) Int. Cl.
*H01L 33/52* (2010.01)

(52) U.S. Cl.
CPC ..................................... *H01L 33/52* (2013.01)
USPC .......... 438/29; 257/79; 257/81; 257/E21.502; 257/E33.059; 257/E33.068; 257/E33.072; 257/99; 438/22; 438/24; 438/42

(58) Field of Classification Search
USPC ................ 257/79, 81, 99, E21.502, E33.059, 257/E33.068, E33.072; 438/22, 24, 26, 29, 438/42
See application file for complete search history.

(56) References Cited

U.S. PATENT DOCUMENTS

| 6,607,970 | B1 * | 8/2003 | Wakabayashi | 438/462 |
|---|---|---|---|---|
| 6,707,247 | B2 * | 3/2004 | Murano | 313/501 |
| 6,743,699 | B1 * | 6/2004 | Doan | 438/460 |
| 7,064,047 | B2 * | 6/2006 | Fukasawa et al. | 438/460 |
| 7,842,526 | B2 * | 11/2010 | Hadame et al. | 438/29 |
| 7,851,263 | B2 * | 12/2010 | Fuchinoue | 438/112 |
| 7,883,810 | B2 * | 2/2011 | Fagley et al. | 429/434 |

(Continued)

FOREIGN PATENT DOCUMENTS

| DE | 100 08 203 A1 | 8/2001 |
|---|---|---|
| EP | 1 753 035 A1 | 2/2007 |
| EP | 1 806 782 A2 | 7/2007 |
| JP | 10-229097 A | 8/1998 |
| JP | 11-074410 A | 3/1999 |
| JP | 2000-183218 A | 6/2000 |
| JP | 2003-031526 A | 1/2003 |
| JP | 2003-179269 A | 6/2003 |
| JP | 2007-027585 A | 2/2007 |
| JP | 2007-165789 A | 6/2007 |
| JP | 2007-221044 A | 8/2007 |
| JP | 2007-324205 A | 12/2007 |
| TW | I274657 | 3/2007 |
| WO | 2006/054616 A1 | 5/2006 |

*Primary Examiner* — Matthew W Such
*Assistant Examiner* — David Spalla
(74) *Attorney, Agent, or Firm* — DLA Piper LLP (US)

(57) ABSTRACT

A method for producing a plurality of radiation-emitting components includes A) providing a carrier layer having a plurality of mounting regions separated from one another by separating regions; B) applying an interlayer to the separating regions; C) applying a respective radiation-emitting device to each of the plurality of mounting regions; D) applying a continuous potting layer to the radiation-emitting device and the separating regions; E) severing the potting layer and partially severing the interlayer in the separating regions of the carrier layer in a first separating step; and F) partially severing the interlayer and severing the carrier layer in a second separating step, wherein the interlayer is completely severed by the first and the second separating step.

12 Claims, 3 Drawing Sheets

(56) References Cited

U.S. PATENT DOCUMENTS

| | | |
|---|---|---|
| 2002/0185966 A1 | 12/2002 | Murano |
| 2002/0187570 A1 | 12/2002 | Fukasawa et al. |
| 2003/0080341 A1 | 5/2003 | Sakano et al. |
| 2005/0048698 A1 | 3/2005 | Yamaguchi |
| 2006/0030125 A1 | 2/2006 | Sackrison et al. |
| 2006/0054913 A1 | 3/2006 | Hadame et al. |
| 2006/0252169 A1* | 11/2006 | Ashida ............................ 438/29 |
| 2007/0069232 A1* | 3/2007 | Kameyama et al. ............ 257/99 |
| 2008/0048308 A1 | 2/2008 | Lam |
| 2009/0127680 A1* | 5/2009 | Do et al. ...................... 257/675 |

\* cited by examiner

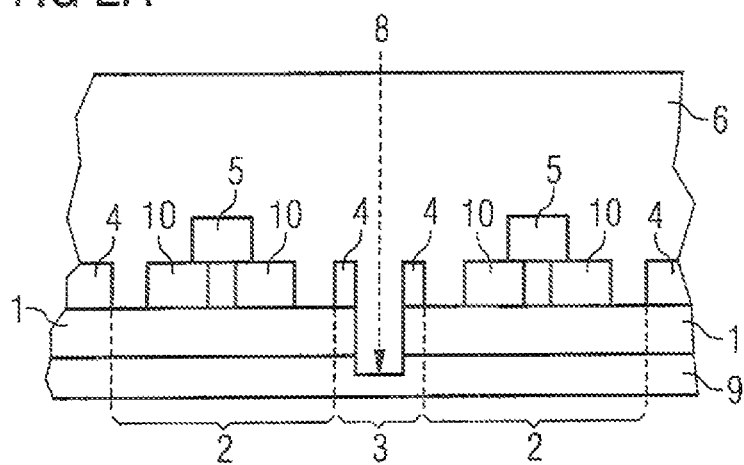
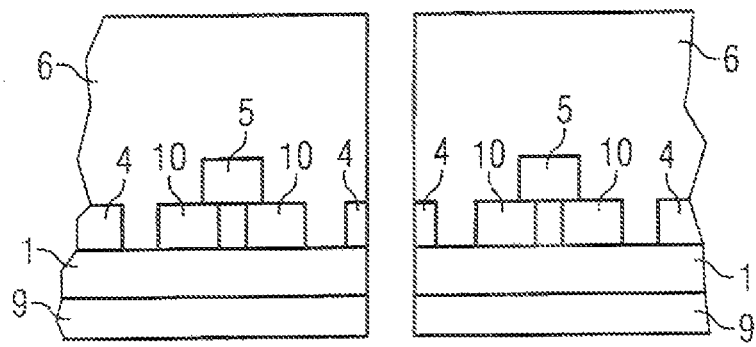

METHOD FOR PRODUCING A PLURALITY OF RADIATION-EMITTING COMPONENTS AND RADIATION-EMITTING COMPONENT

RELATED APPLICATIONS

This is a §371 of International Application No. PCT/DE2009/000249, with an international filing date of Feb. 19, 2009 (WO 2009/103283 A1, published Aug. 27, 2009), which claims the priority of German patent application DE 10 2008 010 510.4, filed Feb. 22, 2008, and of German patent application DE 10 2008 014 927.6, filed Mar. 19, 2008, the subject matter of which is hereby incorporated by reference.

TECHNICAL FIELD

This disclosure relates to a method for producing a plurality of radiation-emitting components and a radiation-emitting component.

BACKGROUND

There is a need to provide a method for producing a plurality of radiation-emitting components. Furthermore, there is a need to provide a radiation-emitting component.

SUMMARY

We provide a method for producing a plurality of radiation-emitting components including A) providing a carrier layer having a plurality of mounting regions separated from one another by separating regions, B) applying an interlayer to the separating regions, C) applying a respective radiation-emitting device to each of the plurality of mounting regions, D) applying a continuous potting layer to the radiation-emitting device and the separating regions, E) severing the potting layer and partially severing the interlayer in the separating regions of the carrier layer in a first separating step, and F) partially severing the interlayer and severing the carrier layer in a second separating step, wherein the interlayer is completely severed by the first and the second separating step.

We also provide a radiation-emitting component including a carrier layer having a mounting region, a radiation-emitting device arranged in the mounting region, and a potting layer on the radiation-emitting device, wherein an interlayer is arranged adjacent to the mounting region between the carrier layer and the potting layer.

BRIEF DESCRIPTION OF THE DRAWINGS

Further advantages, preferred structures and developments of the method for producing a plurality of radiation-emitting components and of the radiation-emitting component will become apparent from the examples explained below and in conjunction with the figures.

FIGS. 2A and 2B show individual method steps of a method in accordance with a further example.

DETAILED DESCRIPTION

Figure 1A:
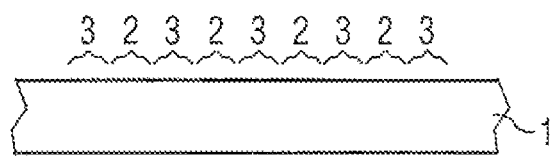
FIGS. 1A to 1F show schematic sectional illustrations of method steps of a method in accordance with one example.

We provide method for producing a plurality of radiation-emitting components comprising:
A) providing a carrier layer having a plurality of mounting regions, wherein the mounting regions are separated from one another by separating regions;
B) applying an interlayer to the separating regions;
C) applying a respective radiation-emitting device to each of the plurality of mounting regions;
D) applying the continuous potting layer to the radiation-emitting device and the separating regions;
E) severing the potting layer and partially severing the interlayer in the separating regions of the carrier layer in a first separating step; and
F) partially severing the interlayer and severing the carrier layer in a second separating step, wherein the interlayer is completely severed by the first and the second separating step.

In this case, the fact that a first layer, a first region or a first device is arranged or applied "on" a second layer, a second region or a second device can mean in this instance and hereinafter that the first layer, the first region or the first device is arranged or applied directly in direct mechanical and/or electrical contact on the second layer, the second region or the second device or with respect to the two further layers, regions or devices. Furthermore, an indirect contact can also be designated, in which further layers, regions and/or devices are arranged between the first layer, the first region or the first device and the second layer, the second region or the second device or the two further layers, regions or devices.

"Separating," "severing" or "separation" mean an alteration of the form of a layer or of a region in which the cohesion is locally eliminated. During separating, severing or separation, parts of a layer or of a region are separated off for changing the form. In this case, the separating, severing or separation can be effected non-mechanically or mechanically, such as, for example, by splitting, material-removing machining or erosion, and can mean altering the form of a layer or of a region using separating tools suitable for splitting, material-removing machining or erosion.

The radiation-emitting components which can be produced in the context of the method described here can have an improved separability of the individual radiation-emitting regions from one another in comparison with known methods for producing radiation-emitting components. In this case, the separability of at least two radiation-emitting components can be qualitatively improved by an interlayer arranged in the separating region between two radiation-emitting components on the carrier layer.

Each of the separating regions is arranged separately from and/or adjacent to intervening mounting regions which in each case have the radiation-emitting devices of the radiation-emitting components. On account of the material composition, the potting layer applied on the radiation-emitting devices can differ from the carrier layer in terms of its physical properties, such as, for example, hardness, stiffness, strength, ductility, fracture toughness or density, such that it is necessary to separate the at least two radiation-emitting components from one another with two separating steps and two different separating tools.

In a conventional method, a direct transition from the potting layer to the carrier layer with, for example, different hardnesses of these layers can have the effect that the separating tool suitable for the separation of the potting layer is damaged and becomes inoperative upon impinging on the carrier layer. The loss of function of the separating tool can be prevented by arranging, in the separating region between two radiation-emitting components, the interlayer between the carrier layer and the potting layer, which can be severed both by a separating tool suitable for the separation of the carrier layer and by a separating tool suitable for the separation of the potting layer and thus serves as a buffer or protective layer.

The separation in the first separating step and in the second separating step can be carried out in each case with a saw. This can mean that method steps E) and F) can be carried out completely with a saw as a single separating tool.

Furthermore, the saw can be used as an example of a separating tool appertaining to material-removing machining to separate the carrier layer, the interlayer and the potting layer with their physically different properties. The use of a saw as a mechanical separating tool also enables cost-effective production of a plurality of radiation-emitting components in high-volume manufacturing.

Furthermore, the separation in accordance with the first separating step can be carried out with a first saw blade. In this first separating step, for completely separating the potting layer and partially severing the interlayer in the separating regions of the carrier layer in accordance with method step E), a first saw blade can be used, which can sever both the potting layer and the interlayer. In this case, the first saw blade is particularly suitable for severing the potting layer, wherein the potting layer is completely severed during the first separating step.

In a conventional method, the potting layer cannot be completely severed during the first separating step with a saw blade since a small part of the potting layer must be retained as a protective layer to prevent impingement of the saw blade on the carrier layer and associated damage to the saw blade. In this case, however, the small part of the remaining potting layer proves to be disadvantageous for the second separating step since residues of the potting layer can deposit on the separating edge and become detached during the further processing of the radiation-emitting component. In known production methods, this leads to contamination of the radiation-emitting components, which necessitates cleaning the radiation-emitting components in an additional cleaning step.

In addition, in known methods, the residues of the potting layer can also deposit on the saw blade during the second sawing step, which leads to an impairment of the sawing result on account of progressive blunting of the saw blade. The saw blade can comprise diamond grains embedded into a plastic matrix, into a metal matrix, or else alternatively into a ceramic matrix, and still have a sufficient sharpness at the beginning of sawing. During sawing, blunted diamond grains can break out of the plastic matrix and thus expose new, sharp diamond grains. The saw blade can be progressively blunted as a result of the residues of the potting layer deposited onto the new, sharp diamond grains in known production methods.

By virtue of our arrangement of the interlayer between the potting layer and the carrier layer, complete separation of the potting layer can be made possible, whereby residues of the potting layer on the second saw blade largely fail to occur and an improved separating result can be achieved.

The second separating step can be carried out with a second saw blade, which is different from the first saw blade. In this case, the second saw blade likewise partially severs the interlayer and completely severs the carrier layer. This means that both the first saw blade and the second saw blade can sever the interlayer without, for example, the first saw blade being damaged by impinging on the carrier layer.

Furthermore, the first and the second saw blade can have an identical thickness. In this case, the first and the second saw blades can each have a thickness of 50 µm to 350 µm. By virtue of the uniform thickness of the first and second saw blades, unevennesses in the separating regions after the first or second separating step can be at least substantially or else wholly avoided.

Furthermore, prior to method step C), in each case at least one electrical contact layer can be applied in the plurality of mounting regions of the carrier layer. In this case, the at least one electrical contact layer serves to establish electrical contact with the radiation-emitting device on the part of the carrier layer and can be shaped, for example, as a conductor track on the carrier layer. For this purpose, the radiation-emitting devices can, for example, each have an electrode which faces the carrier layer and with which the radiation-emitting devices can each be applied to the at least one electrical contact layer in the mounting regions. For counter-contact-making, the radiation-emitting devices can be provided, for example, with an electrode which is remote from the carrier layer and which can be electrically connected to one of the at least one electrical contact layer via a bonding wire, for instance. As an alternative, the radiation-emitting devices can be electrically connected by known so-called "flip-chip" contact-making on in each case at least two electrical conductor tracks in the mounting regions.

Furthermore, the at least one electrical contact layer can comprise an identical material or consist of the same material as the interlayer. By virtue of the fact that the interlayer can comprise the same material as the at least one electrical contact layer, for example, copper, nickel, silver, tungsten, molybdenum or gold or alloys or mixtures with the described metals in a variable percentage ratio or a layer sequence with the materials mentioned, the at least one electrical contact layer and the interlayer can be applied simultaneously in method step B).

The carrier layer can have a first hardness, the interlayer can have a second hardness and the potting layer can have a third hardness, wherein the first hardness can be greater than the second hardness and the second hardness can be greater than the third hardness. Accordingly, the potting layer can have a hardness less than that of the interlayer, wherein the interlayer can in turn have a hardness less than that of the carrier layer.

In this case, the materials which are used for the carrier layer and comprise, for example, a ceramic material, a semiconductor material such as, for example, silicon or metals, which can furthermore also be oxidized on the surface, or a plastic can be distinguished by great hardness. In this case the ceramic material can, for example, comprise aluminium nitride (AlN) and/or aluminium oxide ($Al_2O_3$) or be composed of such compounds.

At least one photoresist, one soldering resist or one metal can be used for the interlayer wherein the metal can be selected from at least one from copper, gold, silver, tungsten, molybdenum and nickel and alloys and mixtures and layer sequences thereof. Such metals can have a hardness less than that of the carrier layer and can thus be softer than the carrier layer. Such materials furthermore equally make it possible that the interlayer can be severed not only by the first saw blade, which is optimized for severing the potting layer having the comparatively lowest hardness, but also by the second saw blade, which is suitable for severing the carrier layer having the comparatively highest hardness.

The potting layer can comprise silicone selected, for example, from methyl-based, phenyl-based and/or fluorinated silicone. Furthermore, mixtures with silicone in variable percentage proportions such as, for example, silicone and epoxy resins are also conceivable. As an alternative, mixtures of methyl-based, phenyl-based or fluorinated silicone can also be used. In this case, silicones can be distinguished by the fact that they are particularly impermeable to air and, in particular, oxygen and also to moisture and are furthermore UV-resistant.

Silicones are characterized in that they enable radiation-emitting components to be operated at high temperatures, for example, up to above 150° C. A potting with silicones additionally enables an optical element to be shaped from the potting layer, such as a lens, for example, which can be arranged as part of the potting layer preferably directly above the radiation-emitting device in the radiation-emitting component.

In the potting layer, preference is given to using methyl-based silicones having a Shore hardness of Shore A60 to Shore A90 and, in particular, preference is given to using methyl-based silicones having a Shore hardness of Shore A70 to Shore A80, which have a high material stability.

Technical analyses of radiation-emitting components produced by the method revealed that the silicone of a silicone-containing potting layer adheres on the interlayer much better if the interlayer comprises soldering resist or photoresist, than if the interlayer comprises a metal. The improved adhesion of the potting layer to the interlayer can contribute to reducing the contamination of the sawing edges of the separating regions by residues of the potting layer.

At least the separating regions of the carrier layer may exhibit an undulation, which is planarized by applying the interlayer in method step B). Undulation of the carrier layer can be determined, for example, by a sensing method, a dynamic pressure method, or by an optical method. Preferably, undulation of the carrier layer can be determined at five to ten points of the carrier layer by a sensing method.

In the course of applying the interlayer to the carrier layer in method step B), firstly material of the interlayer, which material can be liquid, for example, can penetrate into the unevenesses and eliminate the undulation. In particular, the interlayer can preferably be applied with a layer thickness which is greater than or at least equal to the maximum undulation of the carrier layer. Damage to the first saw blade as a result of impinging on the maximum undulation peaks as the maximum undulation of the carrier layer can thus largely be avoided with the aid of the interlayer applied as a protective or buffer layer. Depending on the material used for the carrier layer, undulations of 5 to 50 µm are possible, such that an interlayer is applied with a layer thickness which projects by 5 to 50 µm, and preferably by 5 to 20 µm, beyond the maximum undulation peaks of the undulation of the carrier layer. In this case, the interlayer can be applied photo chemically.

To determine the undulation of the carrier layer by the methods already mentioned above, the carrier layer can be provided in a manner arranged on a film in method step A). For this purpose, the carrier layer can be adhesively bonded, and in this case laminated, for example, onto the film. The film can advantageously make it possible for the carrier layer to bear on an almost totally planar area and can comprise materials such as, for instance, polyvinyl chloride (PVC), polyethylene terephthalate (PET), polyethylene (PE) or polyolefin (PO). The interlayer, the plurality of radiation-emitting devices and the potting layer can subsequently be implemented, in method steps B), C) and D), on an opposite surface of the carrier layer with respect to the film.

Furthermore, the film can be at least partly severed in the second separating step in method F), which promotes the fact that the plane produced can be retained in the further production method.

A radiation-emitting component can comprise, in particular,
  a carrier layer having a mounting region,
  a radiation-emitting device arranged in the mounting region, and
  a potting layer on the radiation-emitting device,
  wherein an interlayer is arranged adjacent to the mounting region between the carrier layer and the potting layer.

In this case, the fact that the potting layer is arranged or applied "on" the radiation-emitting device can mean that the potting layer is arranged or applied directly in direct mechanical contact on the radiation-emitting device. Furthermore, an indirect contact can also be designated, in which further layers are arranged between the potting layer and the radiation-emitting device.

An "adjacent" arrangement of the interlayer with respect to the mounting region between the carrier layer and the potting layer can mean here and hereinafter that the interlayer can be arranged in direct contact with the mounting region, such that the interlayer and the mounting region directly adjoin one another. Furthermore, an indirect contact can also be designated, in which further layers or regions are arranged between the mounting region and the interlayer.

Such a radiation-emitting component can be embodied as a semiconductor component, preferably as a light-emitting diode chip or as a laser diode chip.

Furthermore, such a radiation-emitting component can be mounted on surfaces, such as printed circuit boards, for example, by a surface mounting technique. Very dense population of the printed circuit board, primarily population of the printed circuit board on both sides, is thereby possible.

Such a radiation-emitting component can furthermore achieve the JEDEC-1 standard, which can mean that such a radiation-emitting component, for protection against ingress of moisture and oxidation damage, must not be packaged and stored in a so-called "dry pack," but rather can be stored in the environment of the production method. The accumulation of moisture in the radiation-emitting component can thereby largely be avoided, with the result that soldering the radiation-emitting components arranged on conductor tracks, for example, in the reflow method does not lead to cracks in the radiation-emitting component and to delamination of the layers of the radiation-emitting component (so-called "popcorning effect").

The interlayer can surround the mounting region. This can mean that the mounting region is delimited by the interlayer at least two surfaces. Furthermore, this can mean that the radiation-emitting device arranged in the mounting region is surrounded by the interlayer at least two surfaces. The region in which the interlayer surrounds the radiation-emitting device can also be designated as a separating region.

At least one electrical contact layer can be applied at least in the mounting region of the carrier layer. In this case, the at least one electrical contact layer serves for making electrical contact with the radiation-emitting device from below and can be shaped as a bottom electrode, for example, as a conductor track. For counter-contact-making, the radiation-emitting device can be provided with a top electrode, which can comprise a bonding wire, for example.

The radiation-emitting component can furthermore have one or more features as already described further above, thus for instance the material of the electrical contact layer, the different hardnesses of the layers and/or the materials used for shaping the respective layers.

In the examples and figures, identical or identically acting constituent parts are in each case provided with the same reference symbols. The constituent parts illustrated and also the size relationships of the constituent parts among one another should not be regarded as true to scale. Rather, some details of the figures are illustrated with an exaggerated size to afford a better understanding.

FIGS. 1A to 1F illustrate method steps of a method in accordance with one example. FIG. 1A shows a schematic sectional illustration of a method step A), which involves providing a carrier layer 1 having a plurality of mounting regions 2. In this case, the mounting regions 2 are separated from one another by separating regions 3. The separating regions 3 and the mounting regions 2 can be arranged, for example, in columns and rows separated from one another. Preferably, the mounting regions 2 with separating regions 3 arranged in between are arranged areally in columns and rows in a matrix form on the carrier layer 1. The material used for the carrier layer 1 is preferably a ceramic material, a semi-conductor material such as, for example, silicon or metals, which can also be oxidized on the surface, for example, or a plastic material, since it is distinguished by great hardness and by low material costs. In this case, the carrier layer has an undulation of 5 to 50 μm, depending on which material is used for the carrier layer.

Figure 1B:
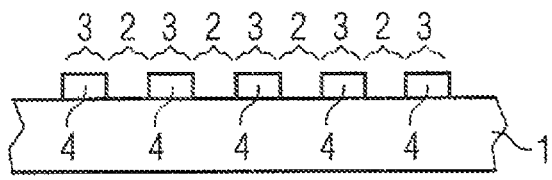

FIG. 1B shows a schematic sectional illustration of a further method step B), which involves applying an interlayer 4 to the separating regions 3 of the carrier layer 1. A photoresist, a soldering resist, or a metal such as, for example, nickel, copper, silver, tungsten, molybdenum or gold or a mixture or an alloy of the metals in variable percentage proportions or a layer sequence with the materials mentioned are preferably used as materials of the interlayer. Undulation of the carrier layer is planarized as a result of the interlayer being applied in the separating regions of the carrier layer. Overall, in this case, a layer thickness of the interlayer 4 is preferred which is at least equal to, but preferably greater than, the maximum undulation of the carrier layer 1 in the separating regions 3. For this purpose, the maximum undulation was determined beforehand at 5 to 10 points on the surface of the carrier layer 1 in the separating regions 3, for example, by a sensing method.

Figure 1C:
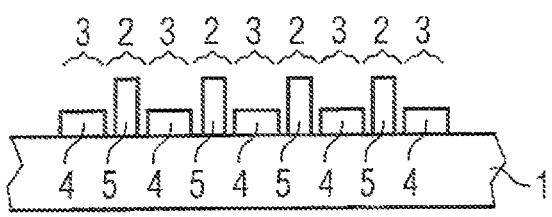

FIG. 1C shows a schematic sectional illustration of a method step C), which involves applying a respective radiation-emitting device 5 to each of the plurality of mounting regions 2. In this case, each of the radiation-emitting devices 5 can directly adjoin the adjacent separating regions 3 or else, as illustrated here, be arranged at a distance from adjacent separating regions 3 in the mounting region 2 on the carrier layer 1. For the electrical linking of the radiation-emitting devices 5, it is possible, prior to method step C), to apply in each case at least one electrical contact layer 10 at least in the plurality of mounting regions 2, as illustrated in FIGS. 2A and 2B. In this case, the material of the electrical contact layer 10 and of the interlayer 4 can comprise the same material or be composed of the same material. In that case it is possible for the electrical contact layer 10 and the interlayer 4 to be applied to the mounting regions 2 and to the separating regions 3, respectively, in patterned fashion in one method step.

Figure 1D:
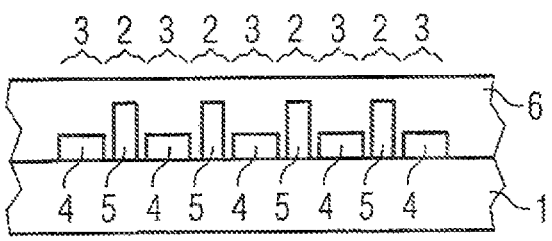

FIG. 1D shows a schematic sectional illustration of a method step D), which involves applying a continuous potting layer 6 to the radiation-emitting devices 5 and the interlayer 4 in a large-area manner. The potting layer 6 can preferably contain methyl-based or phenyl-based silicone, from which a lens can be shaped. The potting layer 6 is therefore preferably arranged on the radiation-emitting device 5 such that the lens of the potting layer 6 bears directly on the radiation-emitting device 5.

Figure 1E:
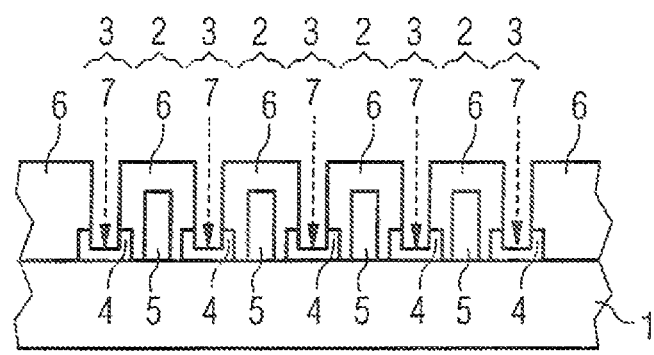

FIG. 1E shows a schematic sectional illustration of a method step E), which involves completely severing the potting layer 6 and partially severing the interlayer 4 in a first separating step 7. In this case, the course of the first separating cut 7 is illustrated by dashed arrows 7. By virtue of the fact that the potting layer 6 is completely severed in this first separating step 7, smooth sawing edges can arise without overhangs of the potting layer 6.

Figure 1F:
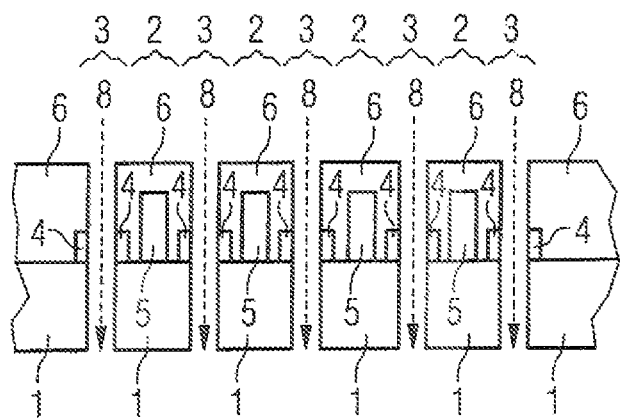

FIG. 1F shows a schematic sectional illustration of a method step F), which involves partially severing the interlayer 4 and completely severing the carrier layer 1 in a second separating step 8 (dashed arrows). In this case, the interlayer 4 is completely severed by the first separating step 7 illustrated in FIG. 1E and by the second separating step 8 illustrated in FIG. 1F). Consequently, a plurality of radiation-emitting components finally arise with method step F), which components can be separated by means of a saw, for example. Two different saw blades can be used for the separation of the radiation-emitting components, wherein the saw blade used for the first separating step 7 is in this case optimized for completely separating the potting layer 6, while the second saw blade for the second separating step 8 is suitable for the separation of the carrier layer 1. In this case, the interlayer 4 preferably comprises a material such as, for example, a photoresist, a soldering resist or a material such as copper, nickel, silver, tungsten, molybdenum or gold, or a mixture or an alloy or a layer sequence thereof, such that the interlayer 4 can be severed not only with a saw blade which is optimized for severing the potting layer 6 having the comparatively lowest hardness, but also with a saw blade which is suitable for severing the carrier layer 1 having the comparatively highest hardness.

Consequently, a plurality of radiation-emitting components are present at the end of method step F) described in FIG. 1F.

FIGS. 2A and 2B show individual method steps of a method for producing radiation-emitting components in accordance with a further example.

In this case, in comparison with the example of the method in accordance with FIGS. 1A to 1F, the carrier layer 1 is provided in a manner arranged on a film 9 to carry out the separating steps 7 and 8 illustrated in FIGS. 1E and 1F on an area that is as plane as possible. To attain the plane area for further processing processes for the radiation-emitting components, the film 9, as illustrated in a schematic sectional illustration in FIG. 2A, is only partially severed during the second separating step 8 in accordance with method step F). The radiation-emitting devices 5 are arranged on electrical contact layers 10, wherein the electrical contact layers 10 are applied to the carrier layer 1 in the mounting regions 2 prior to applying the radiation-emitting devices 5 in method step C) described above. In the example shown, the radiation-emitting devices 5 are in this case applied by flip-chip mounting.

Complete separation of the radiation-emitting components that have already been separated from one another from the film 9 is effected, finally, at a separating edge in a further method step, whereby a singulation into the plurality of radiation-emitting components is achieved, as shown in FIG. 2B.

This disclosure is not restricted to the examples by the description on the basis of the examples. Rather, the disclosure encompasses any new feature and also any combination of features, which in particular comprises any combination of features in the appended claims, even if these features themselves or the combination of features itself are or is not explicitly specified in the appended claims or the examples.

The invention claimed is:

1. A method for producing a plurality of radiation-emitting components comprising:
   A) providing a carrier layer comprising ceramic material and having a plurality of mounting regions separated from one another by separating regions;
   B) applying an interlayer comprising a photoresist layer or a solder-resist layer to the separating regions and directly to the carrier layer;

C) applying a respective radiation-emitting device to each of the plurality of mounting regions;

D) applying a continuous potting layer having a hardness between hardnesses of the carrier layer and the interlayer to the radiation-emitting device and the separating regions such that 1) in the separating regions said interlayer is located between the carrier layer and the potting layer and 2) the potting layer is in direct contact with the radiation-emitting device;

E) completely severing the potting layer and partially severing the interlayer in the separating regions of the carrier layer, which is free of through-holes, in a first separating step; and F) partially severing the interlayer and completely severing the carrier layer in a second separating step, wherein the interlayer is completely severed by the first and the second separating step.

2. The method according to claim 1, wherein separation in the first and second separating steps is carried out with a saw.

3. The method according to claim 1, wherein separation in the first separating step is carried out with a first saw blade.

4. The method according to claim 3, wherein separation in the second separating step is carried out with a second saw blade and the second saw blade is different from the first saw blade.

5. The method according to claim 4, wherein the first and second saw blades have identical thicknesses.

6. The method according to claim 1, wherein, prior to method step C), at least one electrical contact layer is applied at least in the plurality of mounting regions of the carrier layer.

7. The method according to claim 1, wherein the potting layer comprises:
   1) at least one silicone selected from the group consisting of methyl-based, phenyl-based, fluorinated silicone and mixtures thereof;
   2) silicones selected from the group consisting of methyl-based, phenyl-based, fluorinated silicone and mixtures thereof and epoxy resins; and
   3) methyl-based, phenyl-based and/or fluorinated silicone.

8. The method according to claim 1, wherein at least the separating regions of the carrier layer have an undulation which is planarized by applying the interlayer in method step B).

9. The method according to claim 8, wherein the interlayer has a layer thickness which is greater than or equal to the undulation of the carrier layer.

10. The method according to claim 9, wherein
   the carrier layer is arranged on a film in method step A), and
   applying the interlayer, the plurality of radiation-emitting devices and the potting layer in method steps B), C) and D) is carried out on an opposite surface of the carrier layer with respect to the film.

11. The method according to claim 10, wherein the film is at least partly severed in the second separating step in method step F).

12. A method of producing a plurality of radiation-emitting components comprising:
   A) providing a carrier layer having a plurality of mounting regions separated from one another by separating regions;
   B) applying an interlayer to the separating regions;
   C) applying a respective radiation-emitting device to each of the plurality of mounting regions;
   D) applying a continuous potting layer to the radiation-emitting device and the separating regions such that 1) in the separating regions said interlayer is located between the carrier layer and the potting layer and 2) the potting layer is in direct contact with the radiation-emitting device;
   E) after step D), completely severing the potting layer and partially severing the interlayer in the separating regions of the carrier layer in a first separating step such that 1) the interlayer remains an uninterrupted and contiguous layer in said separating regions and 2) a side of the interlayer facing the carrier is not affected by partially severing the interlayer; and
   F) partially severing the interlayer and completely severing the carrier layer in a second separating step, wherein the interlayer is completely severed by the first and the second separating step.

* * * * *